(12) United States Patent
Chen

(10) Patent No.: US 9,780,324 B2
(45) Date of Patent: Oct. 3, 2017

(54) ORANGIC LIGHT EMITTING DIODES (OLED)

(71) Applicant: Shenzhen China Star Optoelectronics Technology Co., Ltd., Shenzhen, Guangdong (CN)

(72) Inventor: Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 137 days.

(21) Appl. No.: 14/778,289

(22) PCT Filed: Aug. 24, 2015

(86) PCT No.: PCT/CN2015/087928
§ 371 (c)(1),
(2) Date: Sep. 18, 2015

(87) PCT Pub. No.: WO2017/020366
PCT Pub. Date: Feb. 9, 2017

(65) Prior Publication Data
US 2017/0170422 A1    Jun. 15, 2017

(30) Foreign Application Priority Data

Aug. 6, 2015   (CN) .......................... 2015 1 0477722

(51) Int. Cl.
*H01L 51/52*   (2006.01)
*H01L 27/32*   (2006.01)

(52) U.S. Cl.
CPC ...... *H01L 51/5212* (2013.01); *H01L 51/5228* (2013.01); *H01L 27/3244* (2013.01); *H01L 2251/301* (2013.01); *H01L 2251/558* (2013.01)

(58) Field of Classification Search
CPC . H01L 51/52; H01L 51/5212; H01L 51/5228; H01L 27/3244; H01L 2251/301
See application file for complete search history.

(56) References Cited

U.S. PATENT DOCUMENTS

| 5,619,058 A | 4/1997 | Kim |
| 2016/0100470 A1* | 4/2016 | Chen ..................... H05B 33/10 29/846 |

(Continued)

FOREIGN PATENT DOCUMENTS

| CN | 1513280 A | 7/2004 |
| CN | 1832224 A | 9/2006 |

(Continued)

*Primary Examiner* — Phuc Dang
(74) *Attorney, Agent, or Firm* — Andrew C. Cheng

(57) ABSTRACT

An OLED includes a first electrode, a second electrode arranged on the first electrode, a light emitting layer arranged between the first electrode and the second electrode, and a conductive layer arranged within the light emitting layer or being directly contacted with the light emitting layer. In view of the above, by configuring a conductive layer within the OLED, the OLED may be adjusted and balanced by an external voltage such that the OLED may not be limited to the circuit input between two electrodes. In this way, the lighting brightness of the OLED may be adjusted. In addition, the evaporated conductive layer may not damage the light emitting layer, and thus the OLED component of top-emission may be adopted.

12 Claims, 4 Drawing Sheets

(56) References Cited

U.S. PATENT DOCUMENTS

2016/0163926 A1* 6/2016 Chang .................... H01L 51/50
                                                              257/89
2016/0163992 A1* 6/2016 Bae ..................... H01L 51/0058
                                                              257/40

FOREIGN PATENT DOCUMENTS

| CN | 102916030 A | 2/2013 |
| JP | 08279628 A | 10/1996 |
| JP | 2000182782 A | 6/2000 |

* cited by examiner

ORANGIC LIGHT EMITTING DIODES (OLED)

CROSS-REFERENCE TO RELATED APPLICATION

This is a national stage application of PCT Application Number PCT/CN2015/087928, filed on Aug. 24, 2015, claiming foreign priority of Chinese Patent Application Number 201510477722.0, filed on Aug. 6, 2015.

BACKGROUND OF THE INVENTION

1. Field of the Invention

The present disclosure relates to OLED, and more particularly to an OLED capable of adjusting the current of the organic layer.

2. Discussion of the Related Art

Usually, OLED includes an anode, a cathode, and a light emitting layer. FIG. 1 is a section view of the conventional OLED. As shown in FIG. 1, the OLED 100 includes an anode 110, a hole injection layer 120, a light emitting layer 130, an electron injection layer 140, and a cathode 150. The cathode 150 is generally made by metallic material, such as Al, and the anode is made by material such as ITO. The operating principles of the OLED 100 will be described below. When the voltage is applied between the anode 110 and the cathode 150, the hole injected from the anode 110 passes through the hole injection layer 120 and arrives the light emitting layer 130. The electrons injected from the cathode 150 pass through the electron injection layer 140 and arrive the light emitting layer 130. The holes and the electrons are composited with each other on the light emitting layer 130 to generate exciton. The exciton is then activated to be at the base state, and then emits lights. Currently, the transparent anode ITO is a majority. That is, the OLED is of the top-emission state. During the manufacturing process, the bottom emission structure is adopted to prevent the organic material from being damaged by evaporated ITO. That is, the light beams are emitted out from the cathode.

When the 2T1C OLED pixel is formed by OLED, the brightness of the pixels may be non-uniform due to being driven by TFTs. FIG. 2 is a driving circuit diagram of the conventional 2T1C OLED pixel. As shown in FIG. 2, the TFT T1 is turned on so as to charge the capacitor (C). The capacitor (C) is configured for turning on the TFT T2 connected with the data voltage (VDD) to drive the OLED to emit lights, which is a constant current source. However, during the driving process, the threshold voltage of the TFT T2 may be shifted. At the same time, the instability of the manufacturing process may result in different threshold voltage of the TFT T2, and the brightness of the pixels may be non-uniform.

To overcome the above problem, the driving circuit of 3T structure has been developed. By adopting the operation amplifier, the input signals may be amplified such that the voltage of the TFT T2 may be affected by the input signals and thus becomes less sensitive, which compensates the non-uniform and instability.

SUMMARY

In order to overcome the above problem, an improved OLED is provided.

In one aspect, an OLED includes: a first electrode; a second electrode arranged on the first electrode; a light emitting layer arranged between the first electrode and the second electrode; and a conductive layer arranged within the light emitting layer or being directly contacted with the light emitting layer.

Wherein the conductive layer includes Al.

Wherein a thickness of the conductive layer is in a range of 10 nm and 100 nm.

Wherein the first electrode is an anode, and the second electrode is a cathode.

Wherein the OLED further includes a hole injection layer arranged between the first electrode and the light emitting layer, and wherein the conductive layer is arranged between the light emitting layer and the hole injection layer.

Wherein the OLED further includes the electron injection layer arranged between the second electrode and the light emitting layer, and wherein the conductive layer is arranged between the light emitting layer and the electron injection layer.

Wherein the OLED includes: a hole injection layer arranged between the first electrode and the light emitting layer; an electron injection layer arranged between the second electrode and the light emitting layer; and wherein the conductive layer is arranged between the light emitting layer and the hole injection layer and/or between the light emitting layer and the electron injection layer.

Wherein the OLED includes: a hole injection layer arranged between the first electrode and the light emitting layer; a hole transmission layer arranged between the hole injection layer and the light emitting layer; an electron injection layer arranged between the second electrode and the light emitting layer; an electron transmission layer arranged between the electron injection layer and the light emitting layer; and wherein the conductive layer is arranged between the light emitting layer and the hole injection layer and/or between the light emitting layer and the electron injection layer In view of the above, by configuring a conductive layer within the OLED, the OLED may be adjusted and balanced by an external voltage such that the OLED may not be limited to the circuit input between two electrodes. In this way, the lighting brightness of the OLED may be adjusted. In addition, the evaporated conductive layer may not damage the light emitting layer, and thus the OLED component of top-emission may be adopted.

DETAILED DESCRIPTION OF THE EMBODIMENTS

Figure 1:
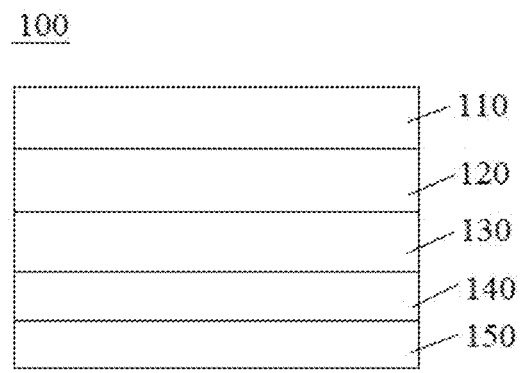
FIG. 1 is a sectional view of the conventional OLED.
Figure 2:
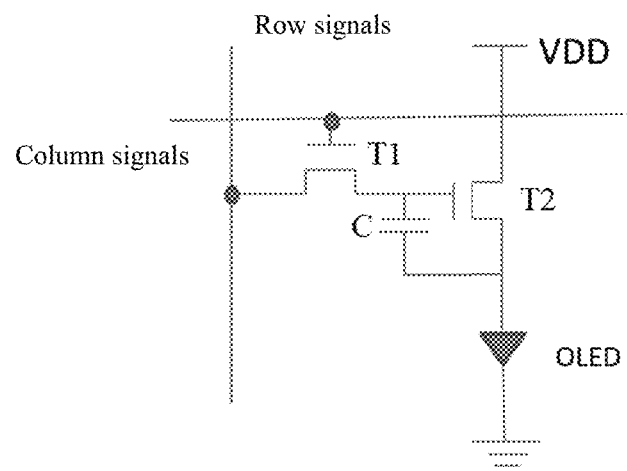
FIG. 2 is a driving circuit diagram of the conventional 2T1C OLED pixel.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

Figure 3:
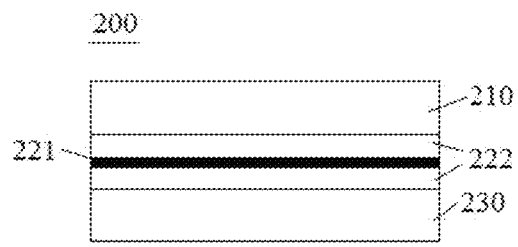
FIG. 3 is a sectional view of the OLED in accordance with one embodiment.

FIG. 3 is a sectional view of the OLED in accordance with one embodiment. As shown in FIG. 3, the OLED 200 includes a first electrode 210, a second electrode 230, a conductive layer 221, and a light emitting layer 222.

The first electrode 210 may be an anode, and the second electrode 230 may be a cathode. In other examples, the first electrode 210 may be a cathode, and the second electrode 230 may be the anode. In the disclosure below, the first electrode is the anode, and the second electrode is the cathode.

The first electrode 210 may be made by materials such as ITO, and the second electrode 230 may be made by metallic material such as Al. However, the materials for the first electrode and the second electrode are not limited to the above.

The light emitting layer 222 is arranged between the first electrode 210 and the light guiding plate 220. In the embodiment, the light emitting layer 222 may be made by $Alq_3$.

The conductive layer 221 is arranged within the light emitting layer 222. The conductive layer 221 may be made by material having great conductivity, such as Al, Mg, or Ag. In addition, the thickness of the conductive layer 221 may be in a range of 10 nm and 100 nm. However, the present disclosure may not be limited to the above as long as the light beams may pass through the conductive layer 221.

In the embodiment, the conductive layer 221 is configured within the light emitting layer 222 such that the structure of the OLED 100, which includes ITO/$Alq_3$/Al, has been adjusted to be the structure having ITO/$Alq_3$/Al/$Alq_3$/Al. As such, the current of the light emitting layer may be adjusted, and so does the brightness of the OLED 100. In addition, the evaporated conducted layer may not harm the light emitting layer, and thus the OLED component of top-emission may be adopted.

In the embodiment, the OLED may include a plurality of functional layers, such as one of hole transmission layer, hole injection layer, electron transmission layer, and electron injection layer. The conductive layer contacts with the light emitting layer directly due to the functional layer, and the conductive layer will be described hereinafter by referring to FIGS. 4 and 5.

Figure 4:
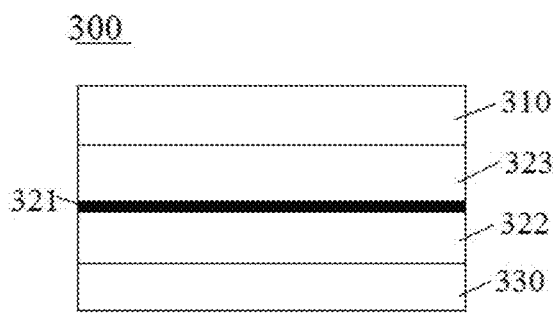
FIG. 4 is a sectional view of the OLED in accordance with another embodiment.
Figure 5:
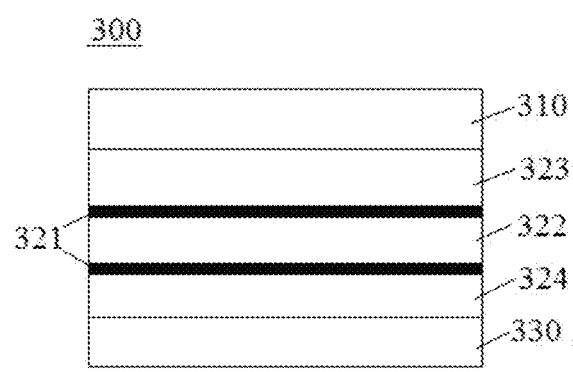
FIG. 5 is a sectional view of the OLED in accordance with another embodiment.

FIG. 4 is a sectional view of the OLED in accordance with another embodiment. FIG. 5 is a sectional view of the OLED in accordance with another embodiment.

Referring to FIG. 4, the OLED 300 includes a first electrode 310, a second electrode 330, a conductive layer 321, a light emitting layer 322, and a hole injection layer 323. It is to be noted that the first electrode 310, the second electrode 330, and the light emitting layer 322 are similar to those in FIG. 3.

The hole injection layer 323 is arranged between the first electrode 310 and the light emitting layer 322. The hole injection layer 323 may be made by conventional materials.

The conductive layer 321 is arranged between the light emitting layer 322 and the hole injection layer 323. The conductive layer 321 may be made by material having great conductivity, such as Al, Mg, or Ag. However, the present disclosure is not limited to the above, as long as the conductive layer is made by the materials suitable for the functional layers and the hole/electrons may pass through such materials.

In addition, the OLED may include the first electrode, the second electrode, the conductive layer, the light emitting layer and the electron injection layer. Under the circumstance, the electron injection layer is arranged between the second electrode and the light emitting layer, and the conductive layer is between the electron injection layer and the light emitting layer.

Referring to FIG. 5, the OLED 300 includes the first electrode 310, the second electrode 330, the conductive layer 321, the light emitting layer 322, the hole injection layer 323, and the electron injection layer 324. It is to be noted that the first electrode 310, the second electrode 330, the light emitting layer 322, and the hole injection layer 323 are similar to those depicted in FIG. 4, and thus the corresponding descriptions are omitted here.

The electron injection layer 324 is arranged between the second electrode 330 and the light emitting layer 322. The electron injection layer 324 may be made by conventional materials.

The conductive layer 321 is arranged between the hole injection layer 323 and the light emitting layer 322, and between the electron injection layer 324 and the light emitting layer 322. However, the present disclosure is not limited to the above. For instance, the conductive layer 321 may be arranged between the hole injection layer 323 and the light emitting layer 322, or the conductive layer 321 may be arranged between the electron injection layer 324 and the light emitting layer 322. The conductive layer 321 may be made by the same materials with the conductive layer in FIG. 4.

In addition, the OLED may include the first electrode, the hole injection layer, the hole transmission layer, the light emitting layer, the electron transmission layer and the electron injection layer in turn. The conductive layer is arranged between the hole transmission layer and the light emitting layer and/or between the electron transmission layer and the light emitting layer.

In the embodiment, the conductive layer contacts with the light emitting layer directly such that the current of the light emitting layer may be adjusted, and so does the brightness of the OLED. In addition, the evaporated conductive layer may not damage the light emitting layer, and thus the OLED component of top-emission may be adopted.

The operations of the conductive layer of the OLED will be described in reference to FIGS. 6A, 6B, and 7.

Figure 6A:
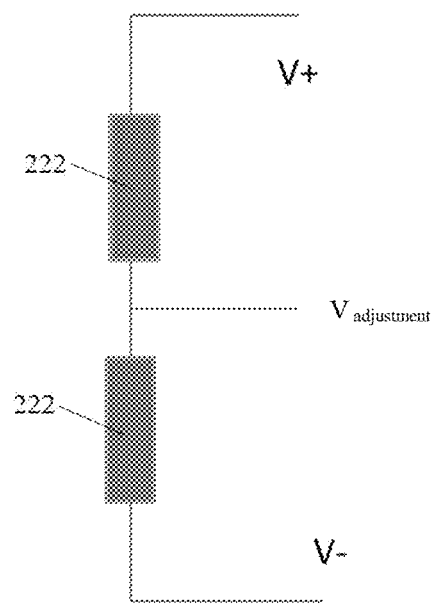
FIGS. 6A and 6B are equivalent circuit diagrams of the OLEDs of FIGS. 3 and 4.
Figure 6B:
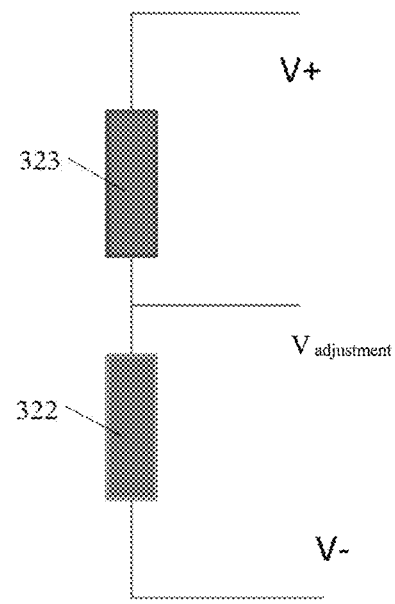

FIGS. 6A and 6B are equivalent circuit diagrams of the OLEDs of FIGS. 3 and 4. FIG. 7 is an equivalent circuit diagram of the OLED of FIG. 4.

Referring to FIG. 6A, the conductive layer 221 is arranged within the light emitting layer 222, and thus the two portions of the light emitting layer 222 divided by the conductive layer 221 may be considered as two resistors. In addition, an electrical field ($V_{adjustment}$) may exist between the two resistors such that the current of the light emitting layer 222 may be adjusted, and so does the brightness of the light beams emitted by the OLED.

Figure 7:
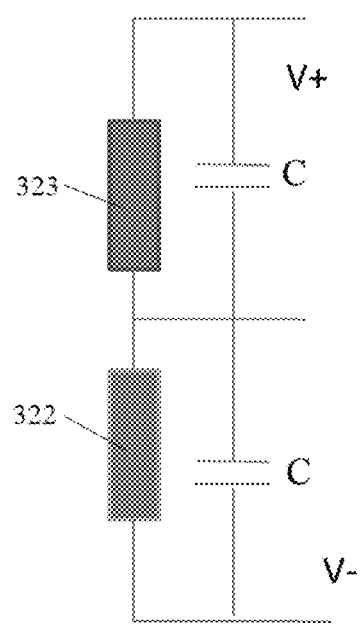
FIG. 7 is an equivalent circuit diagram of the OLED of FIG. 4.

Referring to FIGS. 6B and 7, the conductive layer 321 is configured between the light emitting layer 322 and the hole injection layer 323, and thus the light emitting layer 322 and the hole injection layer 323 may be viewed as two resistors. The electrical field ($V_{adjustment}$) may exist between the two resistors such that the current of the light emitting layer 222 may be adjusted, and so does the brightness of the light beams emitted by the OLED. FIG. 7 is an equivalent circuit diagram of the OLED of FIG. 4. It can be seen that the current of the light emitting layer may be adjusted such that the brightness of the light beams of the OLED may be adjusted.

In view of the above, by configuring the conductive layer within the light emitting layer or by configuring the conductive layer to be directly contacted by the light emitting layer, the current of the light emitting layer of the OLED may be adjusted, and so does the brightness of the OLED. In addition, the evaporated conducted layer may not harm the light emitting layer, and thus the OLED component of top-emission may be adopted.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An OLED, comprising:
   a first electrode;
   a second electrode arranged on the first electrode;
   a light emitting layer arranged between the first electrode and the second electrode; and
   a conductive layer arranged within the light emitting layer to divide the light emitting layer into two portions.

2. The OLED as claimed in claim 1, wherein the conductive layer comprises Al.

3. The OLED as claimed in claim 1, wherein a thickness of the conductive layer is in a range of 10 nm and 100 nm.

4. The OLED as claimed in claim 1, wherein the first electrode is an anode, and the second electrode is a cathode.

5. The OLED as claimed in claim 4, wherein the OLED further comprises a hole injection layer arranged between the first electrode and the light emitting layer, and wherein the conductive layer is arranged between the light emitting layer and the hole injection layer.

6. The OLED as claimed in claim 4, wherein the OLED further comprises an electron injection layer arranged between the second electrode and the light emitting layer, and wherein the conductive layer is arranged between the light emitting layer and the electron injection layer.

7. An OLED, comprising:
   a first electrode;
   a second electrode arranged on the first electrode;
   a light emitting layer arranged between the first electrode and the second electrode;
   a first conductive layer and a second conductive layer respectively arranged above the light emitting layer and below the light emitting layer.

8. The OLED as claimed in claim 7, wherein the first and the second conductive layer comprises Al.

9. The OLED as claimed in claim 7, wherein a thickness of the first and the second conductive layer is in a range of 10 nm and 100 nm.

10. The OLED as claimed in claim 7, wherein the first electrode is an anode, and the second electrode is a cathode.

11. The OLED as claimed in claim 10, wherein the OLED further comprises a hole injection layer arranged between the first electrode and the light emitting layer, and wherein the first conductive layer is arranged between the light emitting layer and the hole injection layer.

12. The OLED as claimed in claim 10, wherein the OLED further comprises an electron injection layer arranged between the second electrode and the light emitting layer, and wherein the second conductive layer is arranged between the light emitting layer and the electron injection layer.

* * * * *